(12) United States Patent
Kinsman

(10) Patent No.: US 7,321,455 B2
(45) Date of Patent: Jan. 22, 2008

(54) MICROELECTRONIC DEVICES AND METHODS FOR PACKAGING MICROELECTRONIC DEVICES

(75) Inventor: Larry D. Kinsman, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/187,105

(22) Filed: Jul. 22, 2005

(65) Prior Publication Data

US 2005/0255628 A1 Nov. 17, 2005

Related U.S. Application Data

(63) Continuation of application No. 10/665,912, filed on Sep. 18, 2003, now Pat. No. 6,934,065.

(51) Int. Cl.
*G02F 1/03* (2006.01)
*H01L 31/203* (2006.01)
*H01L 23/34* (2006.01)
*H01L 21/00* (2006.01)
*H01L 27/00* (2006.01)
*H01L 27/15* (2006.01)

(52) U.S. Cl. ............ 359/245; 438/57; 438/64; 438/66; 257/79; 257/432; 257/433; 257/434; 257/723; 250/208.1; 348/294

(58) Field of Classification Search ........ 359/245, 359/247, 248, 819; 438/110, 116, 121, 122, 438/123, 125, 127, 25, 108, 611, 24, 28, 57, 438/64, 66, 67; 257/678, 680, 686, 711, 257/431, 777, 59, 79, 222, 225, 232, 234, 257/432–434, 723; 250/239, 214.1, 208.1
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,302,778 A * | 4/1994 | Maurinus | 174/52.4 |
| 5,371,397 A | 12/1994 | Maegawa et al. | |
| 5,424,573 A | 6/1995 | Kato et al. | |
| 5,435,887 A | 7/1995 | Rothschild et al. | |

(Continued)

FOREIGN PATENT DOCUMENTS

EP 0 886 323 12/1998

(Continued)

OTHER PUBLICATIONS

U.S. Appl. No. 10/893,022, filed Jul. 16, 2004, Hall et al.

(Continued)

*Primary Examiner*—Loha Ben
(74) *Attorney, Agent, or Firm*—Dickstein Shapiro LLP

(57) ABSTRACT

Microelectronic devices and methods of packaging microelectronic devices are disclosed herein. In one embodiment, a method includes placing a plurality of singulated radiation responsive dies on a support member, electrically connecting circuitry of the radiation responsive dies to contacts of the support member, and forming a barrier on the support member between adjacent radiation responsive dies without an adhesive attaching the barrier to the support member. The barrier is formed on the support member after electrically connecting the circuitry of the dies to the contacts of the support member. The barrier can encapsulate at least a portion of the wire-bonds.

25 Claims, 6 Drawing Sheets

U.S. PATENT DOCUMENTS

| | | | |
|---|---|---|---|
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,368,899 B1 * | 4/2002 | Featherby et al. .......... 438/127 |
| 6,372,548 B2 | 4/2002 | Bessho et al. |
| 6,379,988 B1 * | 4/2002 | Peterson et al. ............... 438/51 |
| 6,407,381 B1 | 6/2002 | Glenn et al. |
| 6,411,439 B2 | 6/2002 | Nishikawa |
| 6,420,204 B2 * | 7/2002 | Glenn ......................... 438/64 |
| 6,441,453 B1 * | 8/2002 | Tindle ......................... 257/437 |
| 6,483,652 B2 | 11/2002 | Nakamura |
| 6,503,780 B1 | 1/2003 | Glenn et al. |
| 6,531,341 B1 * | 3/2003 | Peterson et al. ............ 438/123 |
| 6,541,762 B2 | 4/2003 | Kang et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Shoshan et al. |
| 6,686,588 B1 | 2/2004 | Webster et al. |
| 6,703,310 B2 | 3/2004 | Mashino et al. |
| 6,709,898 B1 * | 3/2004 | Ma et al. ..................... 438/122 |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,794,223 B2 * | 9/2004 | Ma et al. ..................... 438/122 |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 * | 4/2005 | Boon et al. ................... 257/434 |
| 6,885,107 B2 | 4/2005 | Kinsman |
| 6,934,065 B2 | 8/2005 | Kinsman |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0178495 A1 | 9/2004 | Yean et al. |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/901,851, filed Jul. 28, 2004, Derderian et al.
U.S. Appl. No. 10/915,180, filed Aug. 10, 2004, Street et al.
U.S. Appl. No. 10/927,550, filed Aug. 26, 2004, Derderian et al.
DuPont Electronic Materials, Data Sheet, Pyralux PC 2000 Flexible Composites, 4 pages, Oct. 1998, <http://www.dupont.com/fcm>.
Micro Chem, Nano SU-8, Negative Tone Photoresist Formulations 50-100, 4 pages, Feb. 2002, <http://www.microchem.com/products/pdf/SU8_50-100.pdf>.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
U.S. Appl. No. 10/785,466, Kirby.
U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/894,262, Farnworth et al.
U.S. Appl. No. 10/910,491, Bolken et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.

U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.

Aachboun, S. and P. Ranson, "Cryogenic etching of deep narrow trenches in silicon," J. Vac. Sci. Technol. A 18(4), Jul./Aug. 2000, pp. 1848-1852.

Aachboun, S. and P. Ranson, "Deep anisotropic etching of silicon," J. Vac. Sci. Technol. A 17(4), Jul./Aug. 1999, pp. 2270-2273.

Blackburn, J.M. et al., "Deposistion of Conformal Copper and Nickel Films from Supercritical Carbon Dioxide," Science, vol. 294, pp. 141-145, Oct. 5, 2001.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation grantings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboraotry, EPON SU-8 photoresist, 1 page, retrieved from the Internet on Jan. 21, 2003, <http://www.zurich.ibm.com/st/mems/su8.html>.

Intrinsic Viscosity and Its Relation to Instrinsic Conductivity, 9 pages, retrieved from the Internet on Oct. 30, 2003, <http://www.ciks.cbt.nlst.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report - Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, pp. 89-99, MEMES Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages. EE Times, Jul. 18, 2003.

* cited by examiner

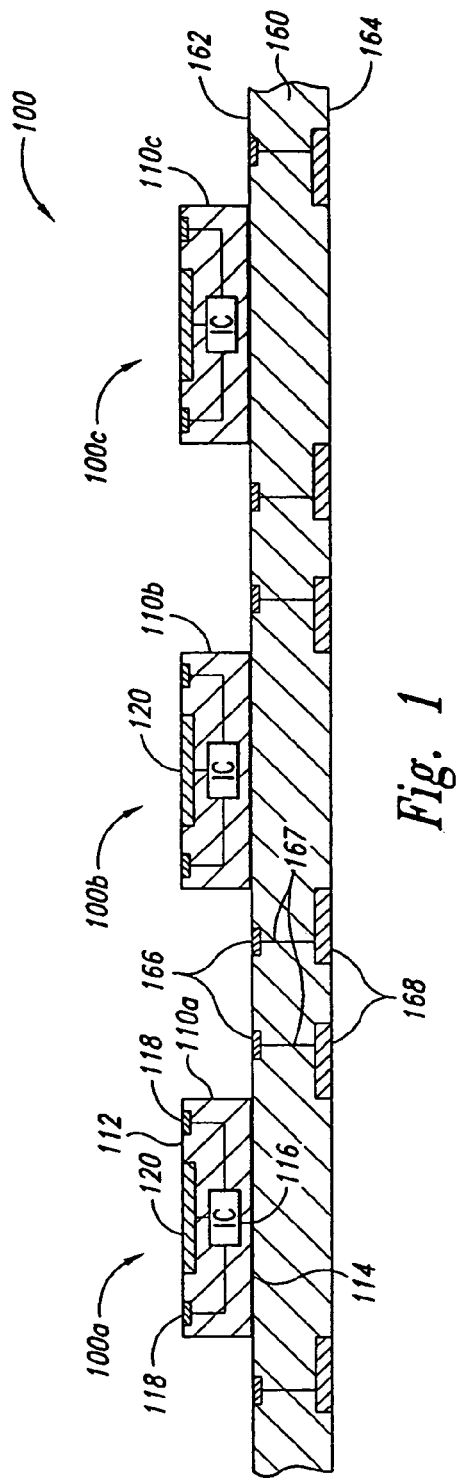
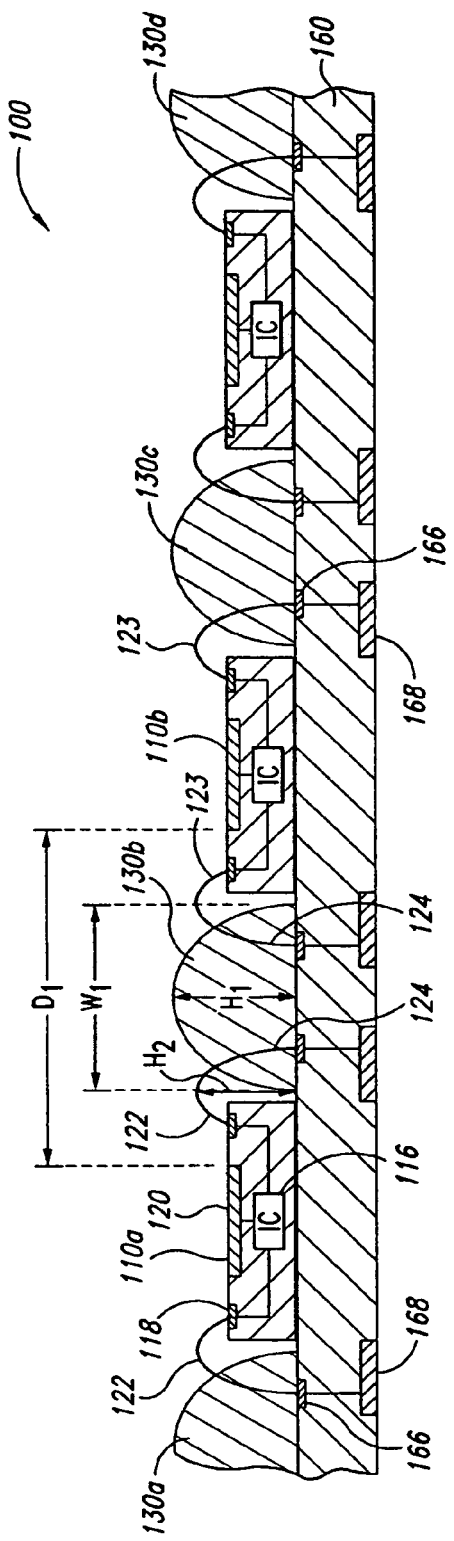

MICROELECTRONIC DEVICES AND METHODS FOR PACKAGING MICROELECTRONIC DEVICES

CROSS-REFERENCE TO RELATED APPLICATION

This application is a continuation of U.S. application Ser. No. 10/665,912, entitled "MICROELECTRONIC DEVICES AND METHODS FOR PACKAGING MICROELECTRONIC DEVICES" filed Sep. 18, 2003, now U.S. Pat. No. 6,934,065, which is incorporated herein by reference in its entirety.

TECHNICAL FIELD

The present invention is related to microelectronic devices and methods for packaging microelectronic devices. In particular, the present invention is directed to microelectronic devices that include radiation responsive dies.

BACKGROUND

Microelectronic devices are used in cell phones, pagers, personal digital assistants, computers, and many other products. A die-level packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by traces in a dielectric material. An array of solder balls is configured so that each solder ball contacts a corresponding ball-pad to define a "ball-grid" array. Packaged microelectronic devices with ball-grid arrays are generally higher grade packages that have lower profiles and higher pin counts than conventional chip packages that use a lead frame.

Packaged microelectronic devices are typically made by (a) forming a plurality of dies on a semiconductor wafer, (b) cutting the wafer to singulate the dies, (c) attaching individual dies to an individual interposer substrate, (d) wire-bonding the bond-pads to the terminals of the interposer substrate, and (e) encapsulating the dies with a molding compound. It is time consuming and expensive to mount individual dies to individual interposer substrates. Also, as the demand for higher pin counts and smaller packages increases, it becomes more difficult to (a) form robust wire-bonds that can withstand the forces involved in molding processes and (b) accurately form other components of die-level packaged devices. Therefore, packaging processes have become a significant factor in producing semiconductor and other microelectronic devices.

Another process for packaging microelectronic devices is wafer-level packaging. In wafer-level packaging, a plurality of microelectronic dies are formed on a wafer and then a redistribution layer is formed on top of the dies. The redistribution layer has a dielectric layer, a plurality of ball-pad arrays on the dielectric layer, and traces coupled to individual ball-pads of the ball-pad arrays. Each ball-pad array is arranged over a corresponding microelectronic die, and the ball-pads in each array are coupled to corresponding bond-pads on the die by the traces in the redistribution layer. After forming the redistribution layer on the wafer, a stenciling machine deposits discrete blocks of solder paste onto the ball-pads of the redistribution layer. The solder paste is then reflowed to form solder balls or solder bumps on the ball-pads. After formation of the solder balls on the ball-pads, the wafer can be cut to singulate the dies. Microelectronic devices packaged at the wafer level can have high pin counts in a small area, but they are not as robust as devices packaged at the die level.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the height of the packaged microelectronic device and the surface area or "footprint" of the microelectronic device on a printed circuit board. Reducing the size of the microelectronic device is difficult because high-performance microelectronic devices generally have more bond-pads, which result in larger ball-grid arrays and thus larger footprints.

Image sensor dies present additional packaging problems. Image sensor dies include an active area that is responsive to light or other electromagnetic radiation. In packaging, it is important to form a cover that protects the active area without obstructing or distorting the passage of light or other electromagnetic radiation to the active area. One existing method for packaging an image sensor die includes placing the die in a recess of a ceramic substrate and attaching a glass window to the substrate over the active area. The window is hermetically sealed to the substrate to enclose the image sensor die. A vacuum pump typically removes air from the gap between the image sensor die and the glass window. An inert gas can then be injected into the gap between the image sensor die and the glass window.

U.S. Pat. No. 6,266,197 discloses another existing method for packaging image sensor dies by attaching and wire-bonding an array of image sensor dies to a carrier substrate. Next, a molded window array is placed over the image sensor dies. The molded window array includes sidewalls that are attached to the carrier substrate between the wire-bonds of adjacent dies and windows that extend between the sidewalls over corresponding dies. The substrate and the attached window array are then cut to form a plurality of individual image sensor packages.

One drawback of packaging image sensor dies in accordance with the above-mentioned methods is that the packaged image sensor dies are relatively bulky and, accordingly, use more space on a circuit board or other external device.

BRIEF DESCRIPTION OF THE DRAWINGS

FIGS. 1–3 illustrate various stages in a method of packaging a plurality of microelectronic devices in accordance with one embodiment of the invention.

FIG. 1 is a schematic side cross-sectional view of the microelectronic devices after attaching a plurality of radiation responsive dies to a support member.

FIG. 2 is a schematic side cross-sectional view of the microelectronic devices after wire-bonding the radiation responsive dies to the support member and forming a barrier on the support member.

FIG. 5 is a schematic side cross-sectional view of a plurality of microelectronic devices after attaching a plurality of radiation responsive dies to a support member.

FIG. 6 is a schematic side cross-sectional view of the microelectronic devices after wire-bonding the dies to the support member and forming a barrier on the support member.

FIG. 7 is a schematic side cross-sectional view of the microelectronic devices after attaching and wire-bonding a plurality of radiation responsive dies to a support member.

FIG. 8 is a schematic side cross-sectional view of the microelectronic devices after forming a barrier.

DETAILED DESCRIPTION

A. Overview

Figure 3A:
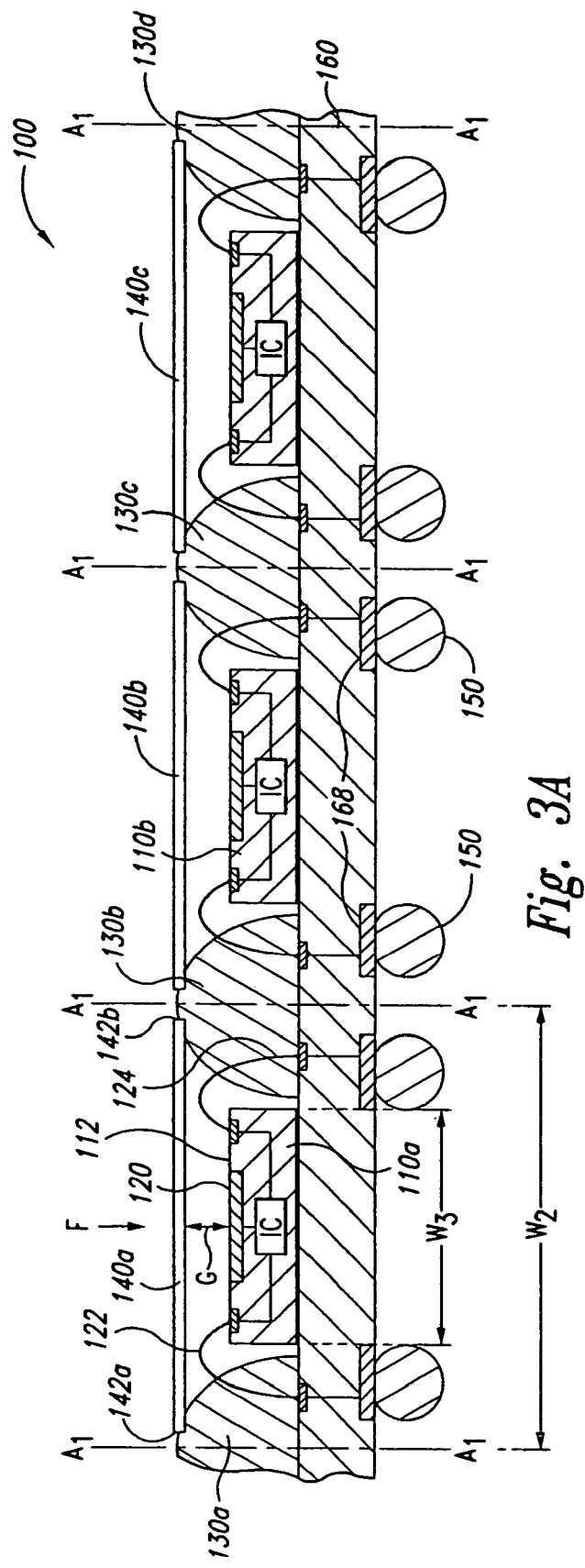
FIG. 3A is a schematic side cross-sectional view of the microelectronic devices after attaching a plurality of radiation transmissive windows to the barrier.

The following description is directed toward microelectronic devices and methods of packaging microelectronic devices. Many specific details of several embodiments are described below with reference to microelectronic devices having radiation responsive dies to provide a thorough understanding of such embodiments. The term "radiation responsive" is used throughout to encompass devices sensitive to various wavelengths of light and/or other forms of radiation, including, but not limited to, charged coupled devices (CCD), complementary metal-oxide semiconductor (CMOS) image sensors, EPROM's, and photodiodes, as well as light-emitting devices including semiconductor lasers and light-emitting diodes. The present invention, however, can be practiced using other types of microelectronic devices and/or microelectromechanical devices. Those of ordinary skill in the art will understand that the invention may have additional embodiments, or that the invention may be practiced without several of the details described below.

Several aspects of the invention are directed to methods of packaging microelectronic devices. In one embodiment, a method includes placing a plurality of singulated radiation responsive dies on a support member, electrically connecting circuitry of the radiation responsive dies to contacts of the support member, and forming a barrier on the support member between adjacent radiation responsive dies without an adhesive attaching the barrier to the support member. The barrier is formed on the support member after electrically connecting the circuitry of the dies to the contacts of the support member. In one aspect of this embodiment, forming the barrier includes dispensing a flowable material onto the support member. The method can further include attaching a radiation transmissive window over an active area of a corresponding die. The window can be attached to the barrier with or without an adhesive. Alternatively, the window can be placed on the active area on the corresponding die before the barrier is formed. In another aspect of this embodiment, electrically connecting the circuitry of the dies to the contacts of the support member includes wire-bonding the dies to the support member.

In another embodiment, a method includes providing a plurality of singulated radiation responsive dies, coupling the individual radiation responsive dies to a support member, wire-bonding the radiation responsive dies to the support member, forming a barrier between adjacent radiation responsive dies that encapsulates at least a portion of wire-bonds on adjacent dies, and attaching a plurality of radiation transmissive windows to the barrier and/or the corresponding dies. The dies include an active area responsive to radiation. In one aspect of this embodiment, forming the barrier includes encapsulating a portion of the radiation responsive dies.

Another aspect of the invention is directed to microelectronic devices. In one embodiment, a plurality of microelectronic devices include a support member, a plurality of radiation responsive dies attached to the support member, a plurality of wire-bonds electrically coupling the radiation responsive dies to the support member, a barrier attached to the support member without an adhesive at a location between the radiation responsive dies, and a plurality of radiation transmissive windows attached to the barrier. The radiation responsive dies have an active area, and the windows cover corresponding active areas. The windows can be attached to the corresponding active areas or spaced apart from the dies by a gap. The barrier includes barrier portions that at least partially encapsulate the wire-bonds of corresponding pairs of adjacent radiation responsive dies. In one aspect of this embodiment, the barrier encapsulates a portion of the radiation responsive dies.

B. Embodiments of Methods for Packaging Microelectronic Devices

FIGS. 1–3 illustrate various stages in a method of packaging a plurality of microelectronic devices 100 (identified individually as 100a–c) in accordance with one embodiment of the invention. For example, FIG. 1 is a schematic side cross-sectional view of the microelectronic devices 100 including a plurality of radiation responsive dies 110 (identified individually as 110a–c) and a support member 160 carrying the dies 110. The radiation responsive dies 110a–c are arranged in a desired array on the support member 160. The radiation responsive die 110a includes a first side 112 and a second side 114 opposite the first side 112. The second side 114 is generally attached securely to the support member 160. The die 110a, for example, can be attached to the support member 160 with an adhesive film, an epoxy, or another suitable material. The die 110a further includes a plurality of bond-pads 118 on the first side 112, an active area 120 on the first side 112, and an integrated circuit 116 (shown schematically) electrically coupled to the active area 120 and the bond-pads 118. The dies 110b and 110c can have the same structure as the die 110a, but in some embodiments, the dies 110a–c can have different features to perform different functions.

The support member 160 can be a lead frame or a substrate such as a printed circuit board to carry the radiation responsive dies 110. In the illustrated embodiment, the support member 160 includes a first side 162 having a plurality of contacts 166 and a second side 164 having a plurality of pads 168. The contacts 166 can be arranged in arrays for attachment to the corresponding bond-pads 118 on the dies 110, and the pads 168 can be arranged in arrays for attachment to a plurality of electrical couplers (e.g., solder balls). The support member 160 further includes a plurality of traces 167 that electrically couple the contacts 166 to the corresponding pads 168.

FIG. 2 is a schematic side cross-sectional view of the microelectronic devices 100 after wire-bonding the radiation responsive dies 110 to the support member 160 and forming a barrier 130 (portions of which are identified individually as 130a–d) on the support member 160. After attaching the radiation responsive dies 110 to the support member 160, a plurality of wire-bonds 122 are formed to electrically couple the dies 110 to the support member 160. More specifically, the wire-bonds 122 include a proximal portion 123 coupled to the bond-pads 118 of the dies 110 and a distal portion 124 coupled to the contacts 166 of the support member 160. Accordingly, the integrated circuit 116 of each die 110 can be electrically coupled to corresponding pads 168.

After wire-bonding, the barrier 130 is formed on the support member 160 to protect the dies 110 from the external environment and to provide a support for a plurality of radiation transmissive windows (FIG. 3). The barrier 130 can be a flowable material that is dispensed onto the support member 160 through a needle or another suitable process. Suitable materials include epoxy and other similar materials, such as those made by Ablestik Laboratories of Rancho Dominguez, Calif., and Henkel Loctite Corporation of Rocky Hill, Conn. In other embodiments, the barrier 130 can be formed on the support member 160 by screen printing, molding, stenciling, or other processes. The barrier material can be selected so that the barrier 130 bonds to the support member 160 without the use of an adhesive. In other embodiments, the barrier 130 can be attached to the support member 160 with an adhesive.

The barrier portions 130a–d have a width $W_1$ less than a distance $D_1$ between the active areas 120 of adjacent dies 110 so that the barrier 130 does not cover the active areas 120. More specifically, in the illustrated embodiment, the barrier 130 covers and encapsulates the distal portion 124 of the wire-bonds 122. In other embodiments, such as those described below with reference to FIGS. 4, 6, and 8, the barrier 130 also partially covers a portion of the dies 110 and the proximal portion 123 of the wire-bonds 122. In the illustrated embodiment, the barrier portions 130a–d have a height $H_1$ greater than a height $H_2$ of the wire-bonds 122 to support the windows (FIG. 3) over the wire-bonds 122. In other embodiments, such as those described below with reference to FIGS. 7 and 8, the height $H_1$ of the barrier portions 130a–d can be less than or equal to the height $H_2$ of the wire-bonds 122.

Figure 3B:
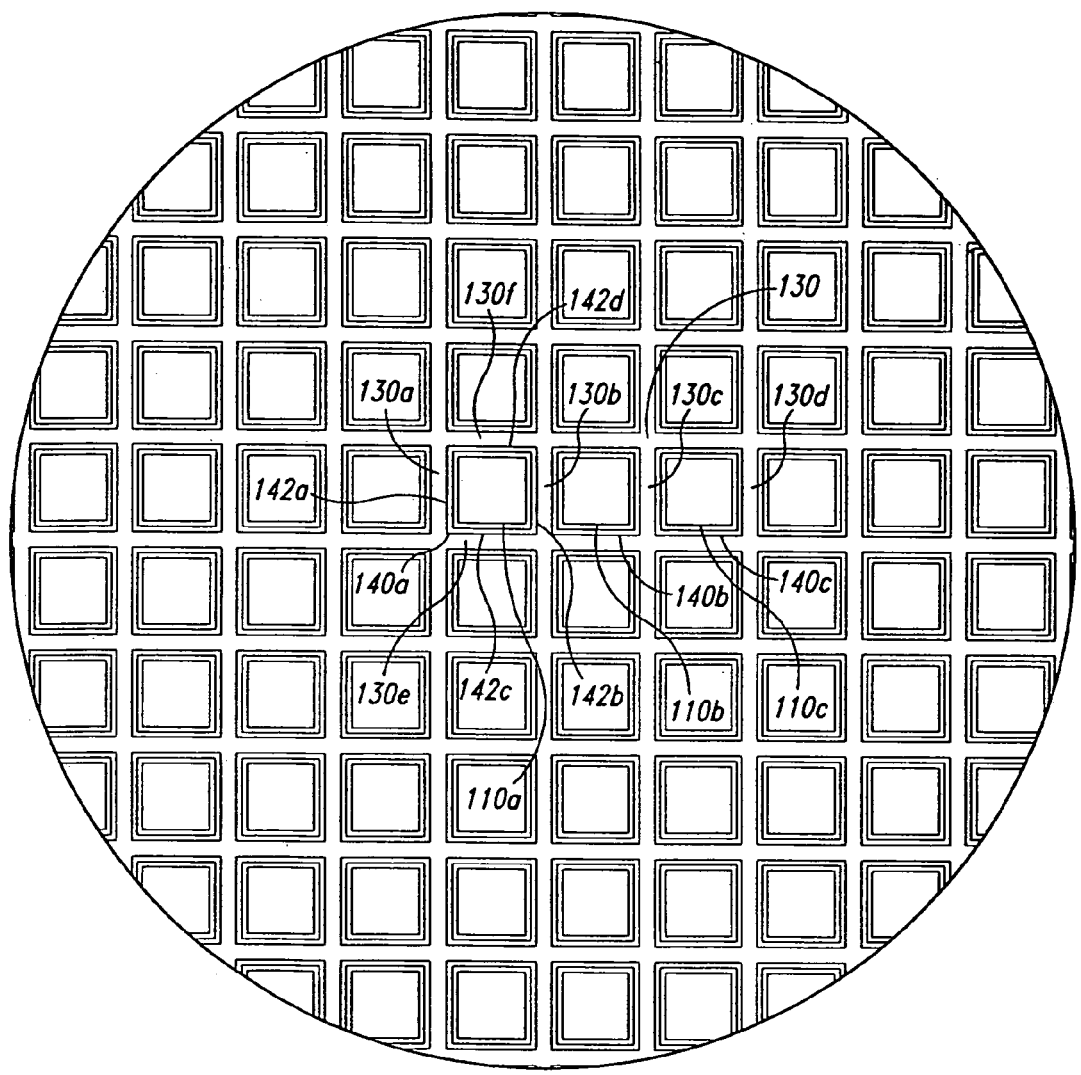
FIG. 3B is a schematic top plan view of the microelectronic devices of FIG. 3A.

FIG. 3A is a schematic side cross-sectional view of the microelectronic devices 100 after attaching a plurality of radiation transmissive windows 140 (identified individually as 140a–c) to the barrier 130, and FIG. 3B is a schematic top plan view of the microelectronic devices 100. Referring to both FIGS. 3A and 3B, in this embodiment, the windows 140 are attached between corresponding barrier portions 130 to enclose corresponding radiation responsive dies 110. For example, a first window 140a includes a first edge 142a attached to a first barrier portion 130a, a second edge 142b attached to a second barrier portion 130b, a third edge 142c attached to a fifth barrier portion 130e, and a fourth edge 142d attached to a sixth barrier portion 130f. The windows 140 therefore extend over the active area 120 of the corresponding dies 110. The windows 140 are made of a transmissive material such as glass to permit light and/or other electromagnetic radiation to pass through.

The windows 140 can be attached to the barrier 130 by exerting a force F (FIG. 3A) to move the edges 142a–d of the windows 140 into the flowable barrier material. In other embodiments, such as the embodiment described below with reference to FIG. 4, the windows 140 can be attached to the barrier 130 with an adhesive. Each window 140 is oriented generally parallel to the corresponding die 110 so that a gap G (FIG. 3A) between the window 140 and the active area 120 is generally consistent across the first side 112 of the die 110. In one embodiment, the gap G can be greater than or equal to 10 microns; alternatively, in other embodiments, such as those described below with reference to FIGS. 5 and 6, the gap G can be less than 10 microns. In additional embodiments, the microelectronic devices 100 can be hermetically sealed and/or the devices 100 can include a sealant between the edges 142a–d of the windows 140 and the barrier 130. In other embodiments, a single unitary window can be attached to the barrier portions 130a–d and cover several of the dies 110.

After attaching the windows 140 to the barrier 130, the barrier 130 can be cured to harden the material and thereby secure the windows 140 over the dies 110. Moreover, in the illustrated embodiment, a plurality of electrical couplers 150 can be deposited or formed on corresponding pads 168 of the support member 160 so that the microelectronic devices 100 can be attached to external devices. After curing the barrier 130 and forming the electrical couplers 150, the barrier 130 and the support member 160 can be cut along lines $A_1$—$A_1$ by scribing, sawing, or another suitable process to singulate the microelectronic devices 100.

One feature of the microelectronic devices 100 of the illustrated embodiment is that the barrier 130 encapsulates the distal portion 124 of the wire-bonds 122. An advantage of this feature is that the size of the microelectronic devices 100 is reduced because the barrier portions 130a–d are positioned closer to the respective dies 110. For example, in the illustrated embodiment, the microelectronic devices 100 have a width $W_2$ 1.2 times greater than a width $W_3$ of the dies 110. In contrast, in prior art microelectronic devices, the barrier portions are attached outside of the distal portion of the wire-bonds and do not encapsulate a portion of the wire-bonds. Consequently, the prior art microelectronic devices are larger than the microelectronic devices 100 of the illustrated embodiment. Larger microelectronic devices have larger footprints and therefore use more space on printed circuit boards or other substrates in cell phones, PDAs, computers, and other products.

C. Other Embodiments of Methods for Packaging Microelectronic Devices

Figure 4:
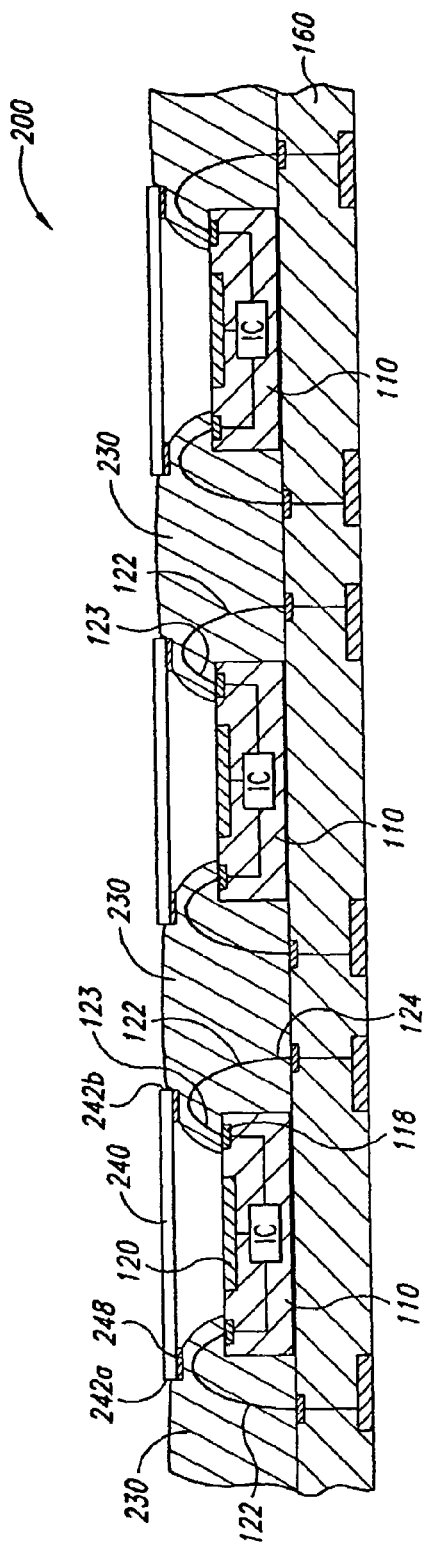
FIG. 4 is a schematic side cross-sectional view of a plurality of microelectronic devices in accordance with another embodiment of the invention.

FIG. 4 is a schematic side cross-sectional view of a plurality of microelectronic devices 200 in accordance with another embodiment of the invention. The microelectronic devices 200 can be generally similar to the microelectronic devices 100 described above with reference to FIGS. 1–3. For example, the microelectronic devices 200 include a plurality of radiation responsive dies 110 attached and wire-bonded to a support member 160. After the dies 110 are attached and wire-bonded to the support member 160, a barrier 230 is formed between the dies 110. The barrier 230 encapsulates the wire-bonds 122 and covers a portion of the dies 110, but it does not cover the active area 120 of the dies 110. The active areas 120 can accordingly receive electromagnetic radiation without interference or obstruction. In other embodiments, the barrier 230 may not completely encapsulate the wire-bonds 122. For example, the barrier 230 may encapsulate the distal portion 124 of the wire-bonds 122 and cover a portion of the dies 110, but may not encapsulate the proximal portion 123 of the wire-bonds 122.

Figure 5:
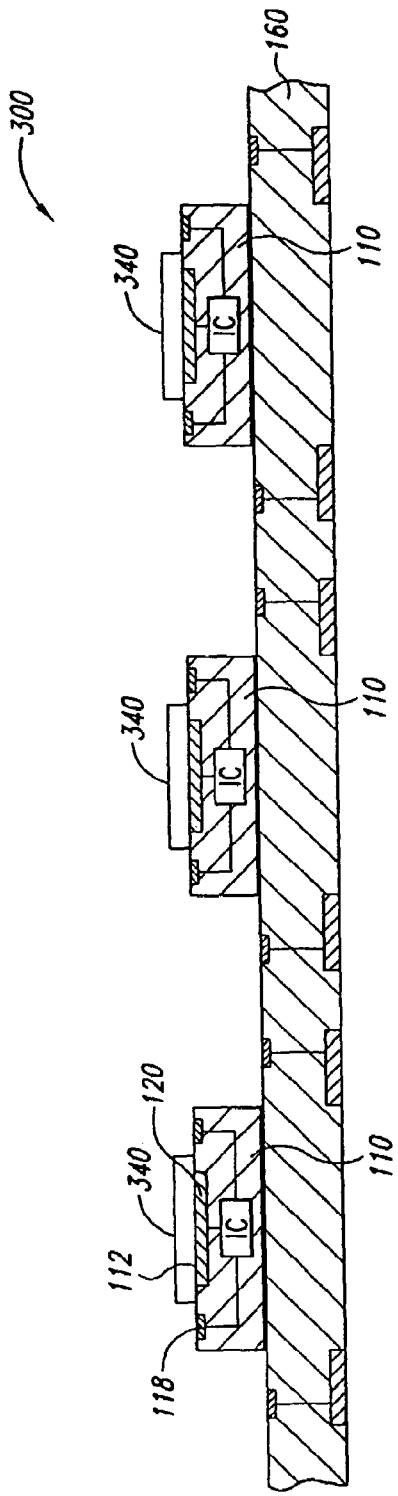
FIGS. 5 and 6 illustrate various stages in a method of packaging a plurality of microelectronic devices in accordance with another embodiment of the invention.
Figure 6:
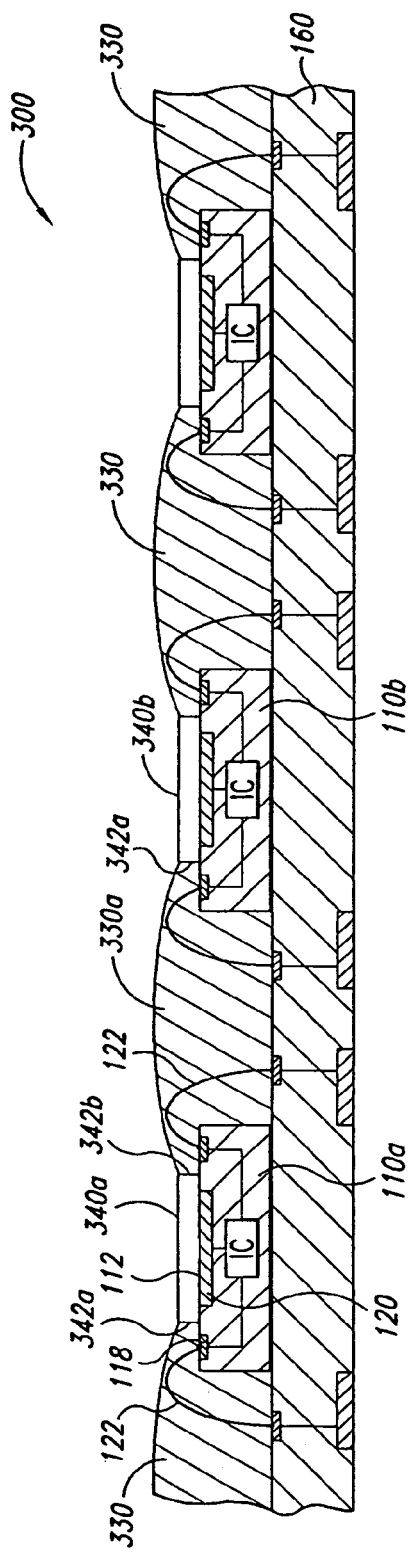

After forming the barrier 230, a plurality of radiation transmissive windows 240 are attached to the barrier 230 over the active area 120 of corresponding dies 110. In the illustrated embodiment, an adhesive 248 bonds first and second edges 242a–b of the windows 240 to the barrier portions 230. The adhesive 248 can be a UV- or thermocurable epoxy or other suitable material. In other embodiments, such as the embodiment described above with reference to FIGS. 1–3, the windows 240 can be attached to the barrier 230 without an adhesive 248, which eliminates a step in the manufacturing process. The barrier 230 can be cured before and/or after the windows 240 are attached. For example, in one embodiment, the barrier 230 is partially cured to a B-stage or tacky state before the windows 240 are attached and then fully cured after attachment. In other embodiments, the barrier 230 may be cured only after the windows 240 are attached;

FIGS. 5 and 6 illustrate various stages in a method for packaging a plurality of microelectronic devices 300 in accordance with another embodiment of the invention. For example, FIG. 5 is a schematic side cross-sectional view of a plurality of radiation responsive dies 110 attached to a support member 160. After attachment, a plurality of radiation transmissive windows 340 are placed on the active area 120 of corresponding dies 110. In the illustrated embodiment, the windows 340 are placed on the die 1110 without an adhesive attaching the windows 340 and the first side 112 of the dies 110. In other embodiments, an adhesive can attach the windows 340 to the corresponding dies 110. For example, an adhesive can be disposed between the windows 340 and the first side 112 of the dies 110 such that the adhesive circumscribes the active area 120. Alternatively, the adhesive can be disposed between the windows 340 and the dies 110 across the active area 120.

In any of these embodiments, the adhesive can be an optical grade material with a high transparency and a uniform mass density to allow maximum light transmission. The adhesive can also be a highly pure material to minimize contamination and thereby reduce or eliminate the loss of images and/or light scattering. In one such embodiment, the pixels in the active area 120 are approximately 3 microns or smaller and the adhesive has an index of refraction of approximately 1.4 or less.

FIG. 6 is a schematic side cross-sectional view of the microelectronic devices 300 after wire-bonding the dies 110 to the support member 160 and forming a barrier 330 on the support member 160. After the windows 340 have been placed on the first side 112 of the dies 110, the dies 110 are wire-bonded to the support member 160. Alternatively, the windows 340 can be placed on the dies 110 before wire-bonding. After placing the windows 340 and wire-bonding, the barrier 330 is formed on the support member 160 between the dies 110. In the illustrated embodiment, the barrier portions 330 extend between the windows 340 of adjacent dies 110. For example, a first barrier portion 330a extends between a second edge 342b of a first window 340a and a first edge 342a of a second window 340b. The barrier portions 330 accordingly encapsulate the wire-bonds 122 and cover portions of the dies 110. The barrier 330 can subsequently be cured to secure the windows 340 over the active area 120 of the corresponding dies 110.

Figure 7:
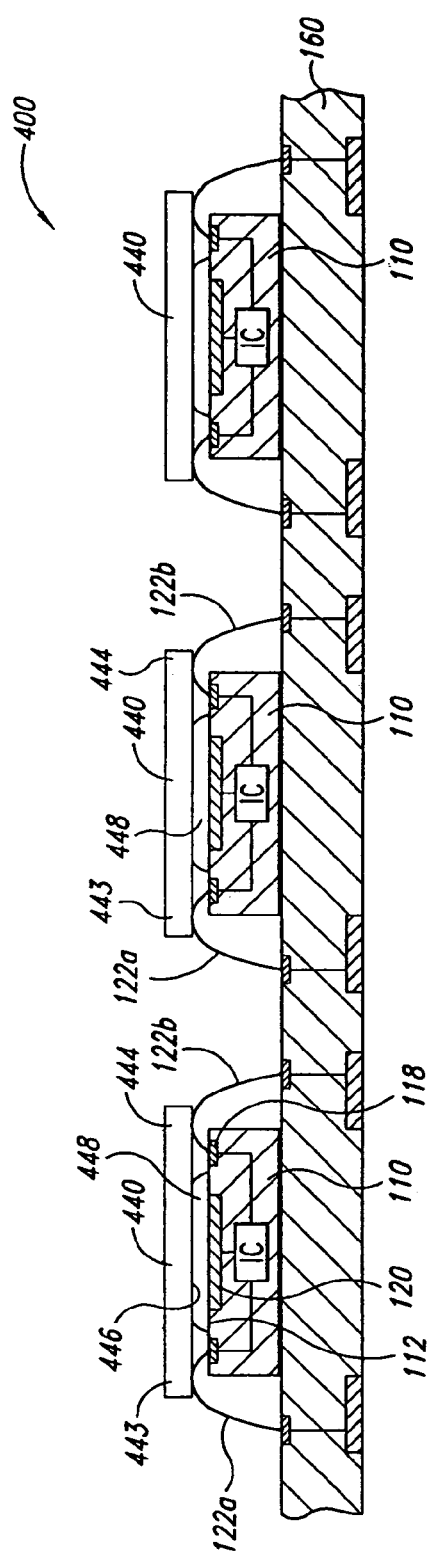
FIGS. 7 and 8 illustrate various stages in a method of packaging a plurality of microelectronic devices in accordance with another embodiment of the invention.
Figure 8:
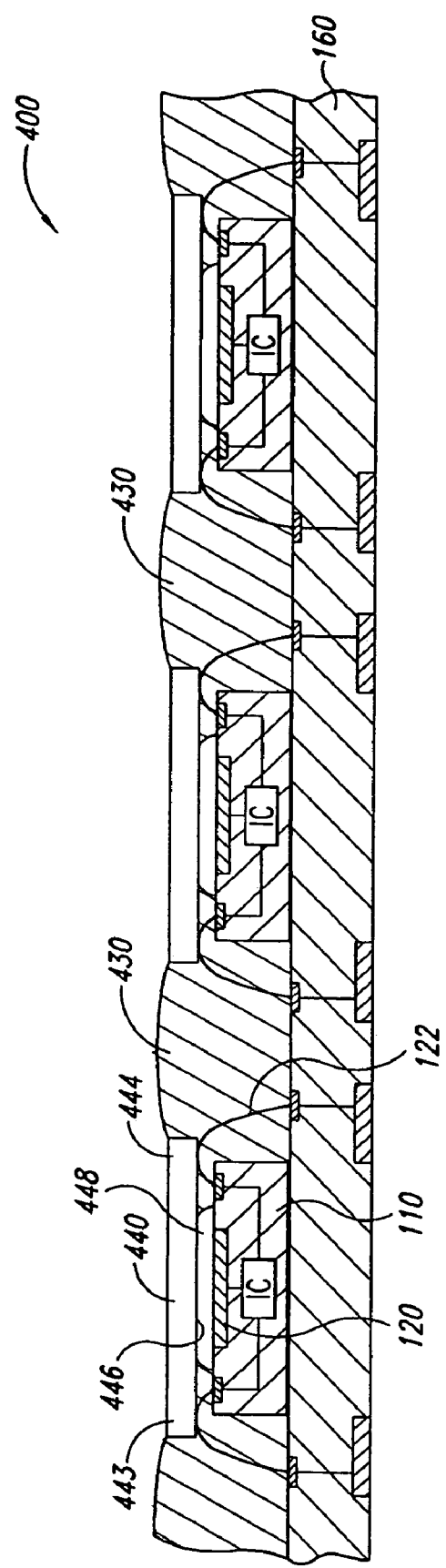

FIGS. 7 and 8 illustrate various stages in a method of packaging a plurality of microelectronic devices 400 in accordance with another embodiment of the invention. For example, FIG. 7 is a schematic side cross-sectional view of the microelectronic devices 400 after attaching and wire-bonding a plurality of radiation responsive dies 110 to a support member 160. After wire-bonding, a plurality of radiation transmissive windows 440 are placed on the wire-bonds 122. More specifically, the windows 440 include a first portion 443 supported by corresponding first wire-bonds 122a and a second portion 444 supported by corresponding second wire-bonds 122b. In the illustrated embodiment, an adhesive 448 is disposed between the windows 440 and the dies 110. The adhesive 448 can be similar to the adhesive described above with reference to FIG. 5. The adhesive 448 can be dispensed onto a bottom surface 446 of the windows 440 and/or the first side 112 of the dies 110 before the windows 440 are placed onto the wire-bonds 122. Alternatively, the microelectronic devices 400 may not include an adhesive, or the adhesive 448 can be arranged so that it circumscribes the active area 120 on the dies 110 and forms a chamber between the windows 440 and the dies 110.

FIG. 8 is a schematic side cross-sectional view of the microelectronic devices 400 after forming a barrier 430. After the windows 440 are placed on the wire-bonds 122, the barrier 430 is formed on the support member 160 between the dies 110. Portions of the barrier 430 can wick into the gap between the windows 440 and the dies 110 such that the barrier 430 encapsulates the wire-bonds 122. In other embodiments, the barrier 430 may not completely encapsulate the wire-bonds 122. In additional embodiments, the barrier 430 can be formed on the support member 160 before the windows 440 are placed on the wire-bonds 122. In any of these embodiments, the barrier 430 can be subsequently cured to secure the windows 440 over the active area 120 of the dies 110.

From the foregoing, it will be appreciated that specific embodiments of the invention have been described herein for purposes of illustration, but that various modifications may be made without deviating from the spirit and scope of the invention. Accordingly, the invention is not limited, except as by the appended claims.

I claim:

1. A method of manufacturing a plurality of microelectronic imaging units, the method comprising:
    attaching a plurality of singulated imaging dies to a support member, the individual imaging dies comprising an image sensor, an integrated circuit operably coupled to the image sensor, and a plurality of external contacts operably coupled to the integrated circuit;
    wire-bonding the external contacts of the imaging dies to corresponding terminals on the support member;
    building a footing on the support member between adjacent imaging dies such that the footing encapsulates a distal portion of the individual wire-bonds proximate to the terminals; and
    coupling covers over at least a portion of the footing so that the covers are positioned over the image sensors.

2. The method of claim 1 wherein building the footing on the support member comprises depositing a flowable material onto the support member.

3. The method of claim 1 wherein building the footing on the support member comprises constructing the footing on the support member such that the footing contacts at least one end of the individual imaging dies.

4. A method of manufacturing a plurality of microelectronic imaging units, the method comprising:
    placing a plurality of singulated imaging dies on a support member, the individual imaging dies comprising an image sensor, an integrated circuit operably coupled to the image sensor, and a plurality of external contacts operably coupled to the integrated circuit; electrically connecting the external contacts of the imaging dies to corresponding terminals on the support member;

depositing a flowable material onto the support member to form a support surface between adjacent imaging dies after placing the singulated imaging dies on the support member; and attaching at least one cover over at least a portion of the support surface with an adhesive so that the cover is positioned over a corresponding image sensor.

5. The method of claim 4 wherein depositing the flowable material onto the support member comprises dispensing the flowable material such that the material contacts at least one end of the individual imaging dies.

6. The method of claim 4 wherein:

electrically connecting the external contacts to the terminals comprises wire-bonding the external contacts to the terminals; and depositing the flowable material onto the support member comprises encapsulating a distal portion of the individual wire-bonds proximate to the terminals.

7. A plurality of microelectronic imaging units, comprising: a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit and electrically coupled to corresponding terminals on the support member;

a footing on the support member between adjacent imaging dies and contacting a portion of the individual imaging dies; and a plurality of covers attached over at least a portion of the footing and positioned over corresponding image sensors.

8. The microelectronic imaging units of claim 7 wherein the footing comprises a flowable material.

9. The microelectronic imaging units of claim 7, further comprising a plurality of wire-bonds having a proximal end coupled to one of the external contacts and a distal end coupled to a corresponding terminal, wherein the footing encapsulates the distal end of the individual wire-bonds.

10. The microelectronic imaging units of claim 7, further comprising an adhesive between the individual covers and the footing.

11. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit;

a plurality of wire-bonds having a proximal portion coupled to one of the external contacts and a distal portion coupled to a corresponding terminal;

a footing on the support member encapsulating the distal portion of the individual wire-bonds;

a plurality of covers positioned over corresponding image sensors; and an adhesive attaching the covers to the footing and/or corresponding imaging dies.

12. The microelectronic imaging units of claim 11 wherein the footing comprises a flowable material.

13. The microelectronic imaging units of claim 11 wherein the footing contacts a portion of the individual imaging dies.

14. A plurality of microelectronic imaging units, comprising: a support member;

a plurality of singulated imaging dies attached to the support member, the individual imaging dies comprising an image sensor, an integrated circuit operably coupled to the image sensor, and a plurality of external contacts operably coupled to the integrated circuit;

a fill material between adjacent imaging dies, the fill material at least partially encapsulating the imaging dies; and a plurality of covers supported by at least a portion of the fill material and positioned over associated image sensors.

15. The imaging units of claim 14, further comprising discrete portions of an adhesive attaching the covers to the corresponding dies, the individual portions of the adhesive being disposed between the associated image sensor and the cover.

16. The imaging units of claim 14, further comprising discrete portions of an adhesive attaching the covers to the corresponding dies, the individual portions of the adhesive being disposed inboard the external contacts.

17. The imaging units of claim 14 wherein the individual covers are inboard the external contacts.

18. The imaging units of claim 14, further comprising a barrier on the support member between adjacent imaging dies.

19. A plurality of microelectronic imaging units, comprising:

a support member having a plurality of terminal arrays;

a plurality of imaging dies including a first side, a second side attached to the support member, an image sensor on the first side, an integrated circuit operably coupled to the image sensor, and a plurality of external contacts operably coupled to the integrated circuit;

a plurality of covers positioned over associated image sensors;

a plurality of wire-bonds electrically connecting the external contacts on the dies to corresponding terminals on the support member; and a barrier on the support member between adjacent imaging dies, at least a portion of the barrier supporting at least one of the plurality of covers.

20. The imaging units of claim 19, further comprising discrete portions of an adhesive attaching the covers to the corresponding dies, the individual portions of the adhesive being disposed between the associated image sensor and the cover.

21. A method of manufacturing a plurality of microelectronic imaging units, the method comprising:

providing a plurality of singulated imaging dies, the individual imaging dies comprising an image sensor, an integrated circuit operably coupled to the image sensor, and a plurality of external contacts operably coupled to the integrated circuit;

coupling the singulated imaging dies to a support member;

electrically connecting the external contacts of the imaging dies to corresponding terminals on the support member;

depositing a flowable material onto the support member to form a base between adjacent imaging dies such that the base contacts at least one end of the individual imaging dies; and attaching at least one cover over at least a portion of the base with the cover over at least one image sensor.

22. The method of claim 21 wherein attaching at least one cover to the base comprises coupling a single cover over several image sensors.

23. The method of claim 21 wherein attaching at least one cover to the base comprises coupling a plurality of covers over corresponding image sensors.

24. The method of claim 21 wherein attaching at least one cover comprises dispensing an adhesive onto the cover and/or the base.

25. The method of claim 21 wherein:
electrically connecting the external contacts to the terminals comprises wire-bonding the external contacts to the terminals; and
depositing the flowable material onto the support member comprises encapsulating a distal portion of the individual wire-bonds proximate to the terminals.

* * * * *

UNITED STATES PATENT AND TRADEMARK OFFICE
CERTIFICATE OF CORRECTION

PATENT NO. : 7,321,455 B2
APPLICATION NO. : 11/187105
DATED : January 22, 2008
INVENTOR(S) : Kinsman Page 1 of 1

It is certified that error appears in the above-identified patent and that said Letters Patent is hereby corrected as shown below:

In column 9, line 60, in Claim 11, after "sensors" delete ";" and insert -- and supported by at least a portion of the footing; --, therefor.

In column 9, lines 61-62, in Claim 11, after "footing" delete "and/or corresponding imaging dies".

Signed and Sealed this

Twentieth Day of May, 2008

JON W. DUDAS
*Director of the United States Patent and Trademark Office*